United States Patent
Weng et al.

(10) Patent No.: US 8,238,071 B2
(45) Date of Patent: Aug. 7, 2012

(54) ELASTIC SHEET STRUCTURE AND ELECTRONIC DEVICE EMPLOYING THE SAME

(75) Inventors: Ming-Hsiang Weng, Taipei Hsien (TW); Chih-Wei Chang, Taipei Hsien (TW); Bhoopal Ponnuvelu, Shenzhen (CN)

(73) Assignee: FIH (Hong Kong) Limited, Kowloon (HK)

( * ) Notice: Subject to any disclaimer, the term of this patent is extended or adjusted under 35 U.S.C. 154(b) by 168 days.

(21) Appl. No.: 12/768,704

(22) Filed: Apr. 27, 2010

(65) Prior Publication Data

US 2011/0149460 A1 Jun. 23, 2011

(30) Foreign Application Priority Data

Dec. 23, 2009 (CN) .......................... 2009 1 0312121

(51) Int. Cl.
  *H01H 47/00* (2006.01)
(52) U.S. Cl. ...................................................... 361/220
(58) Field of Classification Search .................. 361/220, 361/753
  See application file for complete search history.

(56) References Cited

U.S. PATENT DOCUMENTS

| | | | | |
|---|---|---|---|---|
| 5,563,450 A * | 10/1996 | Bader et al. | .................... | 257/785 |
| 5,970,321 A * | 10/1999 | Hively | ........................... | 438/123 |
| 6,456,504 B1 * | 9/2002 | LoForte et al. | ............... | 361/799 |
| 7,794,242 B2 * | 9/2010 | Shi et al. | ......................... | 439/92 |
| 2007/0052100 A1* | 3/2007 | Bellinger | ....................... | 257/758 |
| 2009/0170353 A1* | 7/2009 | Wu | ................................ | 439/80 |
| 2009/0247021 A1* | 10/2009 | Shi et al. | ....................... | 439/816 |
| 2010/0073843 A1* | 3/2010 | Yu et al. | ......................... | 361/220 |
| 2011/0115679 A1* | 5/2011 | Kong et al. | .................... | 343/702 |
| 2011/0149460 A1* | 6/2011 | Weng et al. | .................... | 361/220 |

\* cited by examiner

*Primary Examiner* — Ronald W Leja
(74) *Attorney, Agent, or Firm* — Altis Law Group, Inc.

(57) ABSTRACT

An elastic sheet structure includes an elastic body and a conductive body. The elastic body is capable of elastic deformation, and the conductive body includes a main body, a first elastic arm, and a second elastic arm. The main body is installed into the elastic body; the first elastic arm and the second elastic arm are connected at opposite sides of the main body and extend out from two opposite ends of the elastic body. The first elastic arm is capable of electrically connecting to ground to conduct away static electricity through the second elastic arm, the main body, and the first elastic arm. An electronic device employing the elastic sheet structure is also described.

18 Claims, 5 Drawing Sheets

ELASTIC SHEET STRUCTURE AND ELECTRONIC DEVICE EMPLOYING THE SAME

BACKGROUND

1. Technical Field

The disclosure generally relates to elastic sheet structures and electronic devices using the elastic sheet structures, and particularly to a waterproof elastic sheet structure and an electronic device using the waterproof elastic sheet structure.

2. Description of the Related Art

Electronic devices, such as mobile phones, personal digital assistants (PDAs), are now in widespread use. Consumers may enjoy the full convenience of the electronic devices almost anytime and anywhere. However, in use, covers of the electronic devices may easily generate static electricity, which may damage the electronic devices. Accordingly, the electronic devices are often equipped with conductive elastic sheets connected to grounding sections of the electronic devices to discharge static electricity.

However, a typical elastic sheet is normally fixed on the housing of the electronic device by welding or hot-melt, and so is difficult to replace if damaged. Moreover, it is difficult to precisely install the existing elastic sheets to the housing, often leaving gaps between the two. Therefore, moisture may pass through the gaps into the electronic device, causing damage to internal components of the electronic device.

Therefore, there is room for improvement within the art.

BRIEF DESCRIPTION OF THE DRAWINGS

Many aspects of an elastic sheet structure and an electronic device employing the same can be better understood with reference to the following drawings. The components in the drawings are not necessarily drawn to scale, the emphasis instead being placed upon clearly illustrating the principles of the exemplary elastic sheet structure and electronic device employing the same. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
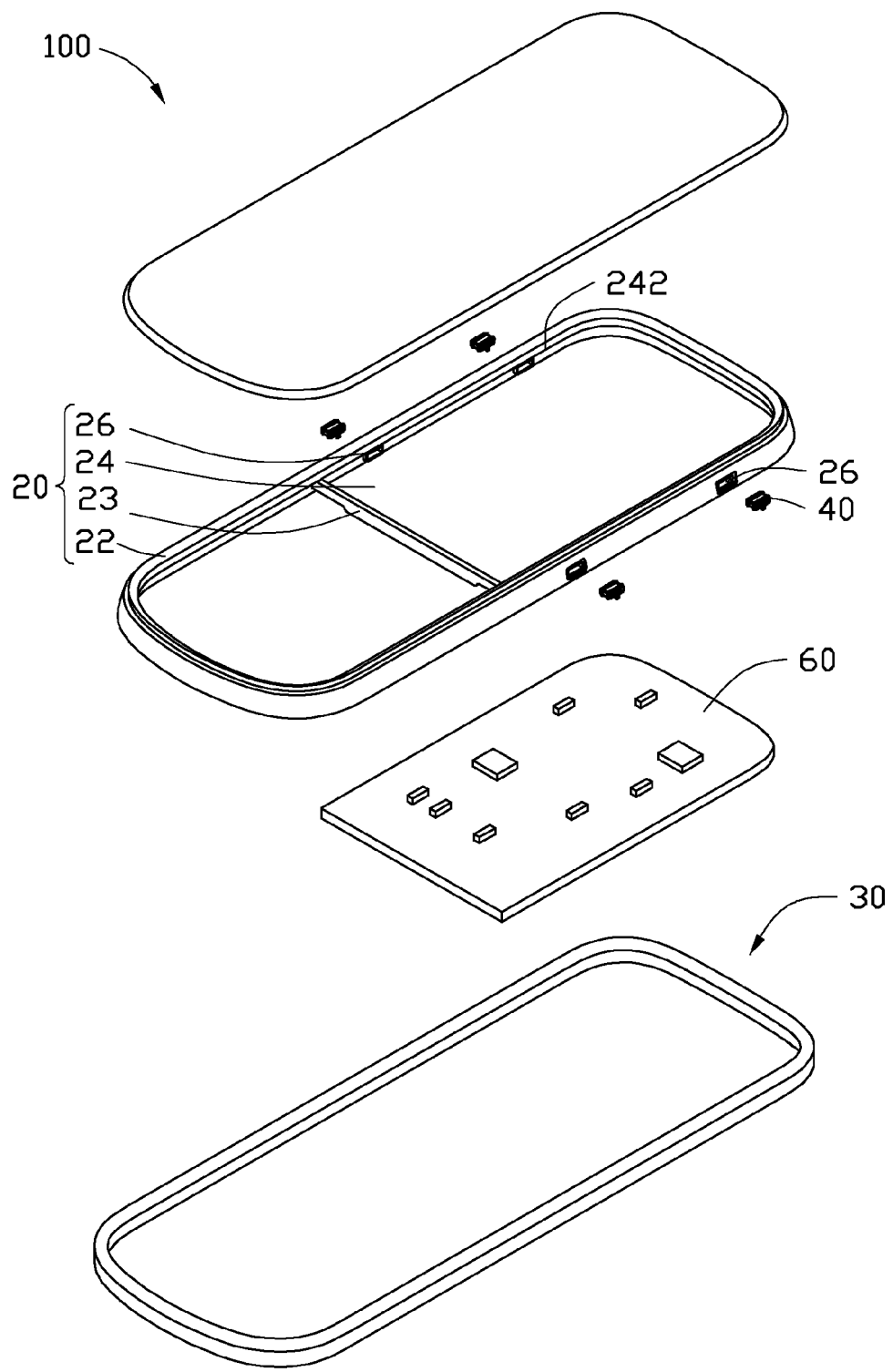
FIG. 1 is an exploded view of an electronic device including a circuit board, an elastic sheet structures, a cover and a housing structure, according to an exemplary embodiment.
Figure 2:
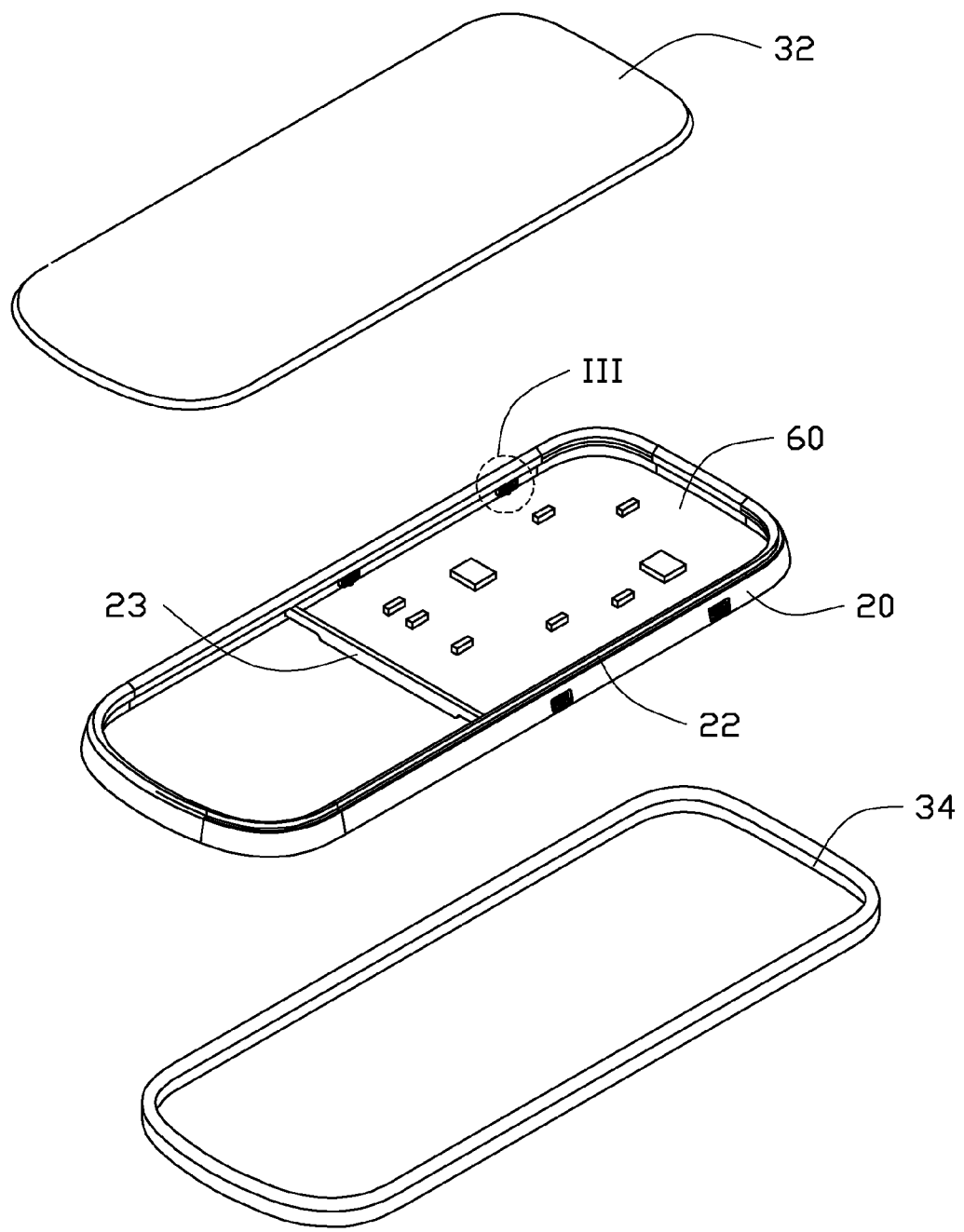
FIG. 2 is similar to FIG. 1 but with the circuit board and the elastic sheet structures installed in the housing structure.
Figure 3:
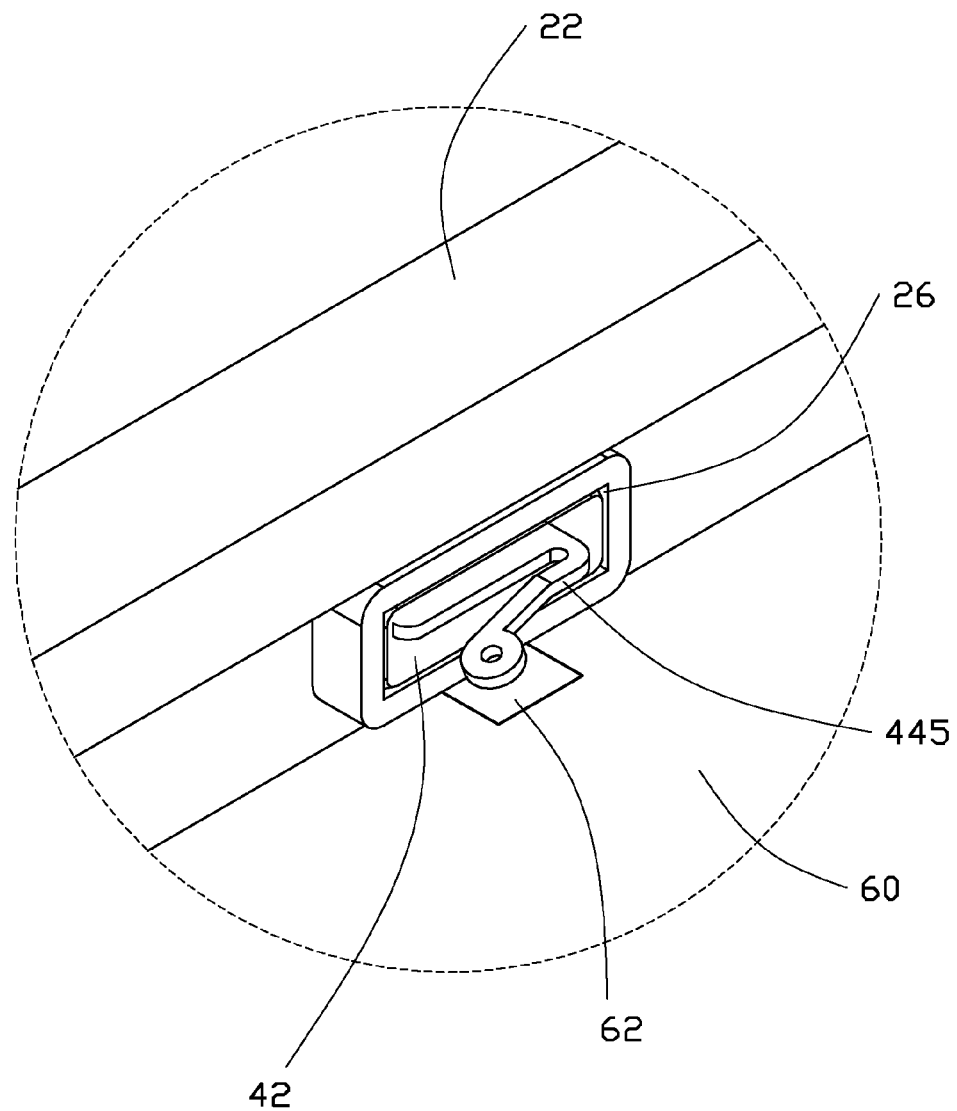
FIG. 3 is an enlarged view of a section III shown in FIG. 2.

Referring to the drawings, FIGS. 1, 2 and 3 show an exemplary embodiment of an electronic device 100, which may be a PDA, a mobile phone, etc. The mobile phone is used here as an example, for the purpose of describing the details of the electronic device 100. The electronic device 100 includes a housing structure 20, a cover member 30, a plurality of elastic sheet structures 40, and a circuit board 60. The housing structure 20 and the cover member 30 are combined together to form the housing of the electronic device 100.

The cover member 30 includes a first cover 32 and a second cover 34 detachably assembled with the first cover 32 thereof. The housing structure 20 is detachable installed in the cover member 30.

The housing structure 20 may be a middle cover of the electronic device 100 in this embodiment. The housing structure 20 is adjacent to the second cover 34 and is detachably assembled inside of the second cover 34. The housing structure 20 includes a frame body 22 and a connecting section 23. The frame body 22 is generally flat and rectangular and its outer surface is closely connected to the inner surface of the second cover 34.

The connecting section 23 is a flat strip with two ends thereof respectively connected to two opposite sides of the frame body 22, thereby dividing the frame body 22 into two parts to accordingly form a receiving space 24. The frame body 22 includes a securing section 242 vertically extending from the inner surface of the frame body 22 towards the receiving space 24. The securing section 242 is capable of receiving and securing the circuit board 60.

The frame body 22 defines a plurality of receiving holes 26 therein respectively corresponding to the elastic sheet structures 40. In this embodiment, the receiving holes 26 are located around the part of the frame body 22 forming the receiving space 24, and connected to the receiving space 24. The receiving holes 26 are capable of receiving the elastic sheet structures 40 therein, resulting in the elastic structures 40 electrically connecting the circuit board 60 to the cover member 30 of the electronic device 100.

Figure 4:
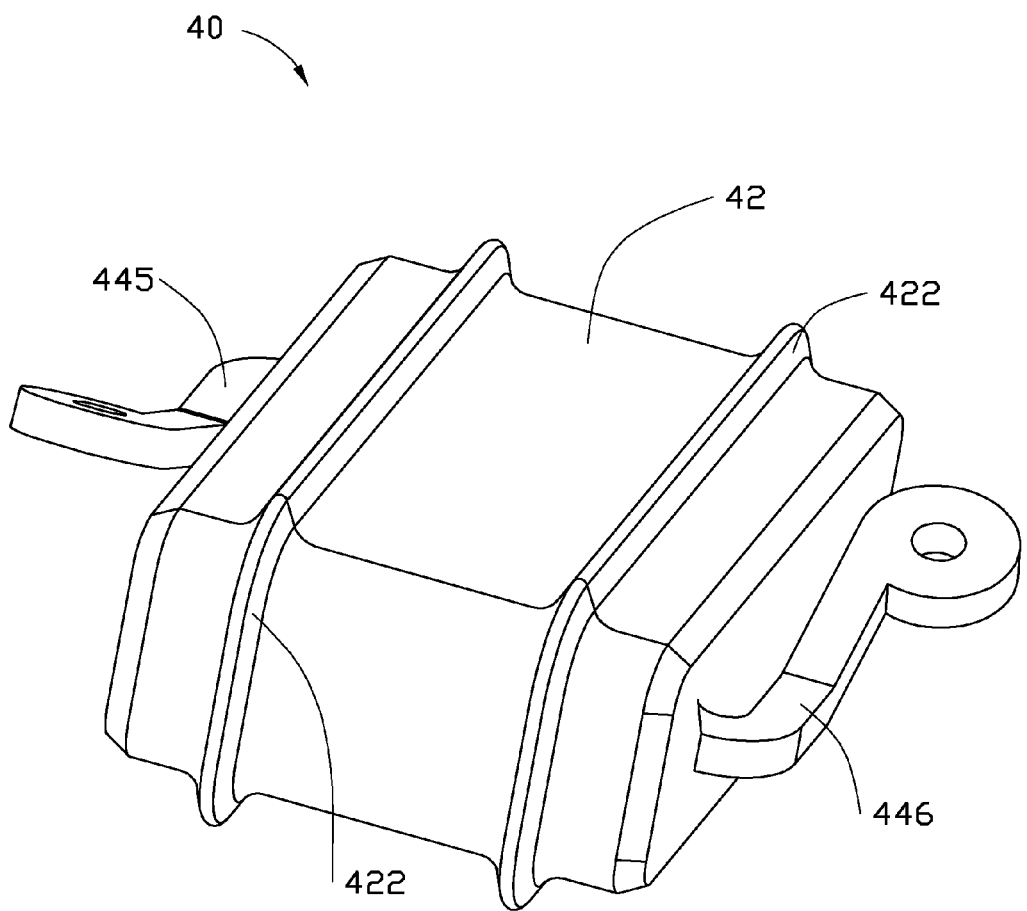
FIG. 4 is an enlarged view of one of the elastic sheet structures shown in FIG. 1.
Figure 5:
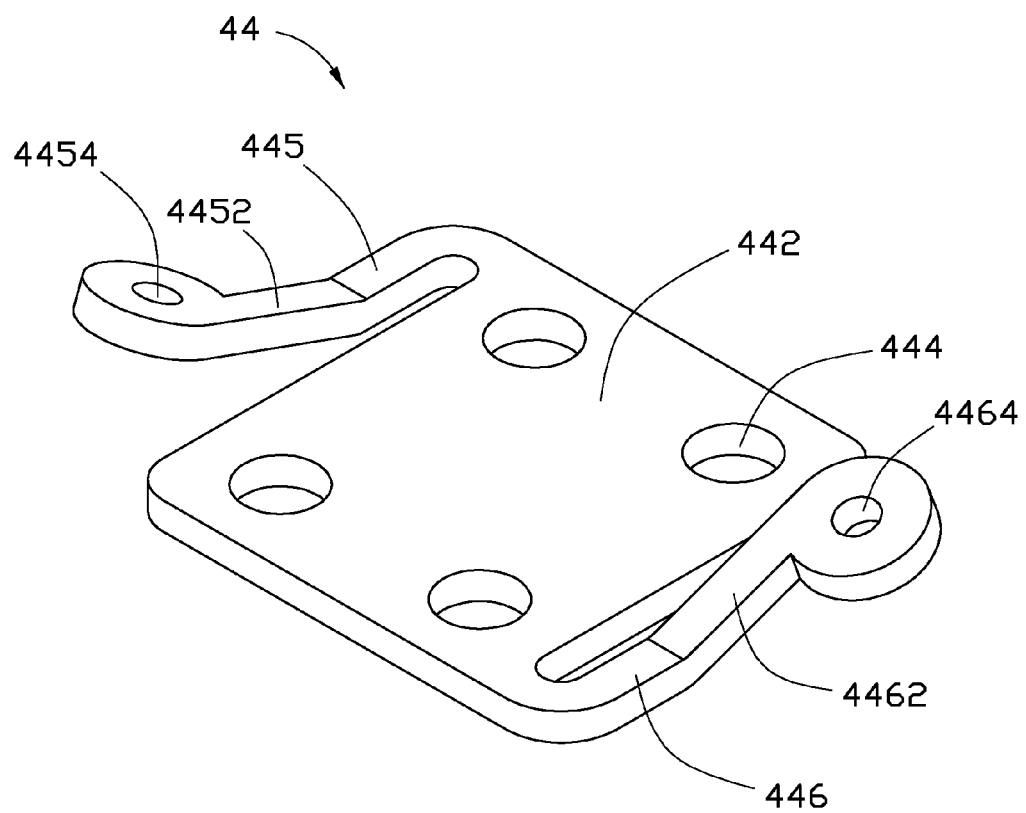
FIG. 5 is an enlarged view of a conductive body of the elastic sheet structure shown in FIG. 4.

Also referring to FIGS. 4 and 5, each elastic sheet structure 40 includes an elastic body 42 and a conductive body 44. The elastic body 42 may be made from rubber or other elastic material and formed by punching and/or cutting a piece of elastic material to form a watertight and dustproof fit when received in the receiving holes 26. The volume of the elastic body 42 is slightly larger than the capacity of the receiving hole 26, therefore when the elastic bodies 42 are respectively accommodated within the corresponding receiving holes 26, the elastic bodies 42 and the receiving holes 26 are closely matchable with each other to prevent water, vapor, dust from entering inside of the electronic device 100.

Ends of each elastic body 42 are tapered to ease insertion of the elastic bodies 42 into the receiving holes 26. Each elastic body 42 has at least one protruding section 422 to flexibly resist sides of the receiving holes 26. When the elastic bodies 42 are received in the receiving holes 26, the protruding sections 422 are deformable to resist the inner wall of the receiving hole 26, to more solidly hold the elastic body 42 in place and contribute to sealing the receiving hole 26, thereby further preventing contaminants such as water, vapor, dust from entering the electronic device 100.

The conductive bodies 44 can be formed by punching and bending a piece of metallic material, such as stainless steel, copper alloy, etc., and are capable of conducting static electricity of the second cover 34 away to the grounding portions. Each conductive body 44 includes a main body 442, a first elastic arm 445, and a second elastic arm 446. The main body 442 is embedded in the elastic body 42, and the first elastic arm 445 and the second elastic arm 446 are fixedly installed at opposite sides of the main body 442 and extend out from the two opposite ends of the elastic body 42.

The main body 442 is substantially flat and rectangular and can be fixed in the elastic body 42 therein by mold forming or other methods. The main body 442 defines a plurality of through holes 444. The main body 442 and the elastic body 42 are fixed with each other through the through holes 444 to more precisely position the conductive body 44 in the elastic body 42.

The first elastic arm 445 is fixedly connected to one side of the main body 442, the second elastic arm 446 is fixedly connected to another side of the main body 442 opposite to the first elastic arm 445. The first elastic arm 445 includes a first bending section 4452, and defines a first positioning hole 4454 with an opening at the distal end thereof. The second elastic arm 446 includes a second bending section 4462, and defines a second positioning hole 4462 with an opening at the distal end thereof.

The first bending section 4452 and the second bending section 4462 bend upwardly away from the surface of the main body 442, and form certain angles with the surface of the main body 442. In detail, when one elastic body 40 is accommodated within any one receiving hole 26, the first bending section 4452 or the second bending section 4462 resists the circuit board 60 and establishes electrical connection with the circuit board 60; the second bending section 4462 or the first bending section 4452 resists the second cover 34 and is electrically connected to the second cover 34. Thus the static electricity is conducted to the circuit board 60 from the cover member 30 through the corresponding elastic sheet structure 40.

In addition, a plurality of hooks or latching portions can be installed on the circuit board 60 and the second cover 34, so that the hooks or the latching portions are latched/fixed in the first positioning holes 4454 and the second positioning holes 4464 to secure the elastic sheet structures 40. Moreover, the hooks or the latching portions can be made from conductive materials; therefore the elastic arms are not only electrically connected to the circuit board 60 and the cover member 30 through the elastic sheet structures 40, but also electrically connected to the cover member 30 and circuit board 60 through the hooks or the latching portions.

The circuit board 60 includes a plurality of ground portions 62 for eliminating static electricity. When any elastic sheet structure 40 is received in the corresponding receiving hole 26, the first elastic arm 445 or the second elastic arm 446 thereof elastically contacts and electrically connects the cover member 30 to the ground portion 62 to conduct the static electricity to the ground portion 62.

Also referring to FIG. 5, when assembling an elastic sheet structure 40 to the housing structure 20 of the electronic device 100, the first elastic arm 445 of the elastic sheet structure 40 is aligned with the corresponding receiving hole 26 of the frame body 22, and the elastic body 42 is moved towards the receiving hole 26. The elastic body 42 and the conductive body 44 are inserted and accommodated in the corresponding receiving hole 26 due to elastic deformation of the elastic body 42. Therefore, the protruding sections 422 and the elastic body 42 resist the inner side of the corresponding receiving hole 26; the first elastic arm 445 extends out from the receiving hole 26 and electrically connects to the corresponding ground portion 62 or the conductive hooks/the latching sections on the circuit board 60. The second elastic arm 446 elastically resists the second cover 34 or the hooks/the latching sections connected to the second cover 34. Thus, the static electricity can be conducted away from the cover member 30 to the circuit board 60 through the first elastic arm 445, the main body 442, and the second elastic arm 446. Similarly, the remaining elastic sheet structures 40 are assembled to the electronic device 100.

In summary, in the elastic sheet structures 40 and the electronic device 100 employing the same of the exemplary embodiment, the elastic body 42 of each elastic sheet structure 40 is elastically assembled to the housing structure 20 of the electronic device 100 through elastic deformation, and the elastic sheet structures 40 are electrically connected to the circuit board 60 and the cover member 30. Therefore, the static electricity on the first cover 32 and the second cover 34 is conducted away from the cover member 30 to the circuit board 60 through the elastic sheet structures 40. Moreover, the elastic bodies 42 elastically resist the housing structure 20, which can effectively prevent the vapor, liquid and other contaminants into the electronic device 100. Furthermore, the elastic sheet structures 40 have a simple structure, and are easy to manufacture and replace, which can effectively reduce production costs.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. An elastic sheet structure, comprising:
   an elastic body; and
   a conductive body comprising a main body, a first elastic arm, and a second elastic arm, wherein the main body is installed in the elastic body, the first elastic arm and the second elastic arm are connected at opposite sides of the main body and extend out from two opposite ends of the elastic body; the first elastic arm is capable of electrically connecting to ground to conduct away static electricity through the second elastic arm, the main body, and the first elastic arm.

2. The elastic sheet structure as claimed in claim 1, wherein the elastic body comprises at least one protruding section, the protruding sections protrude away from the surface of the elastic body, and is capable of elastically resisting a housing structure of an electronic device to secure the elastic body and seal the housing structure.

3. The elastic sheet structure as claimed in claim 2, wherein the conductive body defines a plurality of through holes, the through holes are located on the main body and capable of increasing the binding force between the main body and the elastic body and fixing the conductive body in the elastic body.

4. The elastic sheet structure as claimed in claim 3, wherein the first elastic arm comprises a first bending section, the second elastic arm comprises a second bending section, the first bending section and the second bending section bend in the direction away from the surface of the main body and form certain angles with the surface of the main body, and the first bending section is capable of ground.

5. The elastic sheet structure as claimed in claim 4, wherein the first elastic arm defines a first positioning hole located at the distal end of the first bending section, the second elastic arm defines a second positioning hole located at the distal end of the second bending section, and the first positioning hole and the second positioning hole are capable of latching corresponding latching portions to secure the elastic sheet structure.

6. The elastic sheet structure as claimed in claim 1, wherein the elastic body is made from rubber, and formed by punching and cutting a piece of rubber.

7. The elastic sheet structure as claimed in claim 1, wherein the conductive body is formed by punching and bending a piece of metallic material.

8. An electronic device, comprising:
a housing defining a plurality of receiving holes;
a circuit board positioned in the housing and comprising a plurality of grounding portions capable of ground; and
a plurality of elastic sheet structures assembled to the housing, each sheet structure comprising:
an elastic body; and
a conductive body comprising a main body, a first elastic arm, and a second elastic arm, wherein the main body is installed in the elastic body, the first elastic arm and the second elastic arm are connected at opposite sides of the main body and extend out from two opposite ends of the elastic body; each elastic body is detachably assembled in the corresponding receiving hole, and the first elastic arm is capable of electrically connecting to the corresponding grounding portion, the second elastic arm is connected to the housing to conduct away static electricity through conductive body.

9. The electronic device as claimed in claim 8, wherein the housing comprises a housing structure and a cover member, the housing structure is adjacent to the cover member and is detachably assembled in the cover member, the elastic sheet structure are installed in the sidewalls of the housing structure, and the second elastic arm is elastically connected to the cover member to conduct static electricity from the cover member to grounding portions.

10. The electronic device as claimed in claim 9, wherein the housing structure comprises a frame body, the outer surface of the frame body is connected to the inner surface of the cover member; the receiving holes are located around the frame body.

11. The electronic device as claimed in claim 10, wherein the housing structure further comprises a connecting section, two ends of the connecting section are respectively connected to two opposite sides of the frame body, dividing the frame body into two parts to accordingly form a receiving space, the receiving space is capable of receiving and securing the circuit board therein.

12. The electronic device as claimed in claim 9, wherein the first elastic arm comprise a first bending section, the second elastic arm comprises a second bending section, the first bending section and the second bending section bend in the direction away from the surface of the main body and form certain angles with the surface of the main body, and the first bending section and the second bending section are respectively elastically connected to the grounding portion and the cover member to conduct the static electricity.

13. The electronic device as claimed in claim 12, wherein the first elastic arm defines a first positioning hole located at the distal end of the first bending section, the second elastic arm defines a second positioning hole located at the distal end of the second bending section, and the first positioning hole and the second positioning hole are capable of latching corresponding latching portions of the grounding portion and the cover member to secure the elastic sheet structure.

14. The electronic device as claimed in claim 13, wherein the elastic body comprises a protruding section protruding away from the surface of the elastic body, the protruding section is capable of elastically resisting the housing structure of the electronic device to secure the elastic body and seal the housing structure.

15. The electronic device as claimed in claim 13, wherein the elastic body comprises a plurality of protruding sections, the protruding sections protrude away from the surface of the elastic body, and are capable of elastically resisting the housing structure of the electronic device to secure the elastic body and seal the housing structure.

16. The electronic device as claimed in claim 13, wherein the conductive body defines a plurality of through holes, the through holes are located on the main body and capable of increasing the binding force between the main body and the elastic body and fixing the conductive body in the elastic body.

17. The electronic device as claimed in claim 8, wherein the elastic body is made from rubber, and formed by punching and cutting a piece of rubber.

18. The electronic device as claimed in claim 8, wherein the conductive body is formed by punching and bending a piece of metallic material.

* * * * *